(12) United States Patent
Kojima et al.

(10) Patent No.: US 10,964,974 B2
(45) Date of Patent: Mar. 30, 2021

(54) SOLID ELECTROLYTE, ALL-SOLID-STATE LITHIUM-ION SECONDARY BATTERY, PRODUCTION METHOD FOR SOLID ELECTROLYTE

(71) Applicant: NGK INSULATORS, LTD., Nagoya (JP)

(72) Inventors: Miyuki Kojima, Nagoya (JP); Yosuke Sato, Hashima-Gun (JP); Yuji Katsuda, Tsushima (JP); Yoshiaki Nagasawa, Nagoya (JP); Kazuyuki Kaigawa, Kitanagoya (JP)

(73) Assignee: NGK Insulators, Ltd., Nagoya (JP)

( * ) Notice: Subject to any disclaimer, the term of this patent is extended or adjusted under 35 U.S.C. 154(b) by 183 days.

(21) Appl. No.: 16/126,182

(22) Filed: Sep. 10, 2018

(65) Prior Publication Data
US 2019/0006710 A1    Jan. 3, 2019

Related U.S. Application Data

(63) Continuation of application No. PCT/JP2017/007064, filed on Feb. 24, 2017.

(30) Foreign Application Priority Data

Mar. 16, 2016   (JP) .............. JP2016-052808

(51) Int. Cl.
*C01B 21/097*   (2006.01)
*C23C 14/06*    (2006.01)
(Continued)

(52) U.S. Cl.
CPC ....... *H01M 10/0562* (2013.01); *C01B 21/097* (2013.01); *C23C 14/0676* (2013.01); *C23C 14/34* (2013.01); *C23C 14/352* (2013.01); *H01B 1/08* (2013.01); *H01M 4/382* (2013.01); *H01M 4/525* (2013.01); *H01M 10/0525* (2013.01); *H01M 10/0585* (2013.01);
(Continued)

(58) Field of Classification Search
None
See application file for complete search history.

(56) References Cited

FOREIGN PATENT DOCUMENTS

| JP | 2004-228029 A1 | 8/2004 |
| JP | 2009-046329 A1 | 3/2009 |

(Continued)

OTHER PUBLICATIONS

Mani, Prabhu Doss, "Reactive Sputter Deposition of Lithium Phosphorus Oxynitride Thin Films, A Li Battery Solid State Electrolyte" (2015). Electronic Theses and Dissertations, 2004-2019. 693. (Year: 2015).*

(Continued)

*Primary Examiner* — Ula C Ruddock
*Assistant Examiner* — Amanda Rosenbaum
(74) *Attorney, Agent, or Firm* — Burr & Brown, PLLC

(57) ABSTRACT

A solid electrolyte is constituted by lithium phosphorus oxynitride (LiPON). A multiplication value obtained by multiplying a ratio of a peak intensity of nitrogen atoms having a single bond with one P atom and having a double bond with another P atom to a peak intensity of an $N_2$ state in a Raman spectroscopy spectrum by a ratio of a content amount of N atoms to a content amount of P atoms is greater than or equal to 0.40.

8 Claims, 3 Drawing Sheets

(51) Int. Cl.
  C23C 14/34    (2006.01)
  H01M 10/0525  (2010.01)
  H01M 10/0585  (2010.01)
  H01M 4/38     (2006.01)
  H01M 10/0562  (2010.01)
  H01M 4/525    (2010.01)
  H01B 1/08     (2006.01)
  C23C 14/35    (2006.01)

(52) U.S. Cl.
  CPC ...... *C01P 2002/82* (2013.01); *C01P 2006/40* (2013.01); *H01M 2300/0071* (2013.01)

(56) References Cited

FOREIGN PATENT DOCUMENTS

| | | |
|---|---|---|
| JP | 2011-171247 A1 | 9/2011 |
| JP | 2011-171248 A1 | 9/2011 |
| JP | 2016-033880 A1 | 3/2016 |

OTHER PUBLICATIONS

Mascaraque, Nerea, et al. "An Interpretation for the Increase of Ionic Conductivity by Nitrogen Incorporation in LIPON Oxynitride Glasses." Solid State Ionics, vol. 233, No. 21, 21 Feb. 213, pp. 73-79. (Year: 2013).*

Song, Seung-Wan, et al. "Cycling-Driven Structural Changes in a Thin-Film Lithium Battery on Flexible Substrate." Electrochemical and Solid-State Letters, vol. 12, May 26, 2009, pp. A159-A162. (Year: 2009).*

Kim, Yoon Gu, and H.N.G. Wadley. "Lithium Phosphorous Oxynitride Films Synthesized by a Plasma-assisted Directed Vapor Deposition Approach." J. Vac. Sci. Technol., No. A26, Jan. 2, 2008, pp. 174-183. (Year: 2008).*

English translation of International Preliminary Report on Patentability (Application No. PCT/JP2017/007064) dated Sep. 27, 2018.

J. B. Bates et al., "Electrical Properties of Amorphous Lithium Electrolyte Thin Films," *Solid State Ionics*, 53-56 (1992), pp. 647-654.

B. Fleutot et al., "Investigation of the Local Structure of LiPON Thin Films to Better Understand the Role of Nitrogen on Their Performance," *Solid State Ionics*, 186 (2011), pp. 29-36.

Tristan Pichonat et al., "Further Studies on the Lithium Phosphorus Oxynitride Solid Electrolyte," *Materials Chemistry and Physics*, 123 (2010), pp. 231-235.

International Search Report and Written Opinion (Application No. PCT/JP2017/007064) dated Apr. 18, 2017.

* cited by examiner

US 10,964,974 B2

SOLID ELECTROLYTE, ALL-SOLID-STATE LITHIUM-ION SECONDARY BATTERY, PRODUCTION METHOD FOR SOLID ELECTROLYTE

TECHNICAL FIELD

The present invention relates to a solid electrolyte, an all-solid-state lithium-ion secondary battery and to a production method for a solid electrolyte.

BACKGROUND ART

In recent years, progress has been made in the development of all-solid-state lithium-ion secondary batteries comprising a positive electrode layer, a solid electrolyte layer and a negative electrode layer. The material constituting the solid electrolyte layer is suitably a lithium phosphorus oxynitride-based ceramic material having high lithium ion conductivity (hereinafter referred to as "LiPON") (for example, reference is made to J. B. Bates et. al., "Electrical properties of amorphous lithium electrolyte thin films", Solid State Ionics 53 to 56 (1992) 647-654, B. Fleutot et. al., "Investigation of the local structure of LiPON thin films to better understand the role of nitrogen on their performance", Solid State Ionics 186 (2011) 29 to 36, Tristan Pichonat et. al., "Further studies on the lithium phosphorus oxynitride solid electrolyte", Materials Chemistry and Physics, 123, (2010) 231 to 235).

In particular, "Investigation of the local structure of LiPON thin films to better understand the role of nitrogen on their performance" discloses that lithium ion conductivity is enhanced as the N/P ratio (atomic ratio in the layers) in LiPON increases when formed in a layered configuration.

SUMMARY

However, there is a need to further improve the lithium ion conductivity of LiPON in order to make further improvement to the performance of an all-solid-state lithium-ion secondary battery. In this context, as a result of extensive studies conducted by the present inventors, the new insight has been gained that the lithium ion conductivity of LiPON is affected not only by the N/P ratio as discussed above, but also by the ratio of N atoms, out of all the N atoms, that are present singly as $N_2$ (molecular nitrogen) without binding to a P atom.

It is noted that "Further studies on the lithium phosphorus oxynitride solid electrolyte" detects $N_2$ in the Raman spectroscopy spectrum of LiPON. However this feature is considered to be detection of $N_2$ in the atmosphere used for measurements.

The present invention is proposed based on the new situation discussed above, and has the object of providing a solid electrolyte, an all-solid-state lithium-ion secondary battery and a production method for a solid electrolyte that enable enhancement of lithium ion conductivity.

A solid electrolyte is constituted by lithium phosphorus oxynitride (LiPON). A multiplication value obtained by multiplying a ratio of a peak intensity of nitrogen atoms having a single bond with one P atom and having a double bond with another P atom to a peak intensity of an $N_2$ state in a Raman spectroscopy spectrum by a ratio of a content amount of N atoms to a content amount of P atoms is greater than or equal to 0.40.

The present invention provides a solid electrolyte, an all-solid-state lithium-ion secondary battery and to a production method for a solid electrolyte that enable enhancement of lithium ion conductivity.

DESCRIPTION OF EMBODIMENTS

All-Solid-State Lithium-ion Secondary Battery 100

Figure 1:
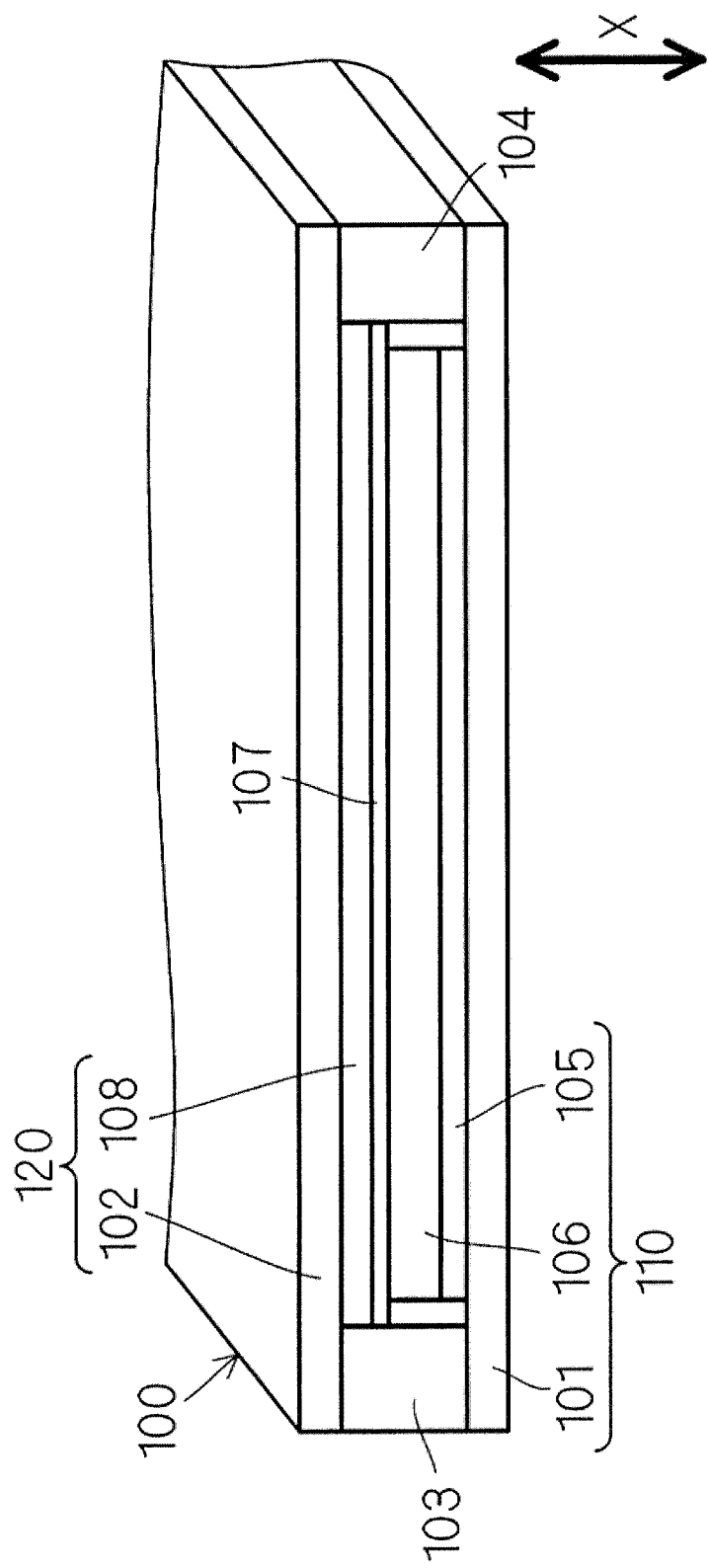
FIG. 1 is a cross sectional view schematically illustrating a configuration of an all-solid-state lithium-ion secondary battery.

FIG. 1 is a cross sectional view schematically illustrating a configuration of an all-solid-state lithium-ion secondary battery 100. The all-solid-state lithium-ion secondary battery 100 has a plate-shaped configuration and is a secondary battery (rechargeable battery) that is capable of repetitive use by charging and discharging.

The all-solid-state lithium-ion secondary battery 100 comprises a positive electrode-side current collecting layer 101, a negative electrode-side current collecting layer 102, outer cladding 103, 104, a current collecting connection layer 105, a positive electrode plate 106, a solid electrolyte layer 107 and the negative electrode layer 108. The all-solid-state lithium-ion secondary battery 100 has a configuration in which the positive electrode-side current collecting layer 101, the current collecting connection layer 105, the positive electrode plate 106, the solid electrolyte layer 107, the negative electrode layer 108 and the negative electrode-side current collecting layer 102 are sequentially stacked in a stacking direction X.

The end portion in the direction of plate width of the all-solid-state lithium-ion secondary battery 100 is sealed by the outer cladding 103, 104. A positive electrode 110 is configured by the positive electrode-side current collecting layer 101, the current collecting connection layer 105 and the positive electrode plate 106. A negative electrode 120 is configured by the negative electrode-side current collecting layer 102 and the negative electrode layer 108.

1. Positive Electrode-Side Current Collecting Layer 101

The positive electrode-side current collecting layer 101 is disposed on an outer side of the positive electrode plate 106. The positive electrode-side current collecting layer 101 is mechanically and electrically connected through the current collecting connection layer 105 to the positive electrode plate 106. The positive electrode-side current collecting layer 101 can function as a positive electrode current collector.

The positive electrode-side current collecting layer 101 can be configured by metal. The metal that configures the positive electrode-side current collecting layer 101 includes stainless steel, aluminum, copper, platinum, nickel and the like, with stainless steel being particularly suitable. The positive electrode-side current collecting layer 101 may be formed in a plate shape or a foil shape, with a foil shape being particularly preferred. Therefore, use of a stainless steel foil is particularly preferred as the positive electrode-side current collecting layer 101.

2. Negative Electrode-Side Current Collecting Layer 102

The negative electrode-side current collecting layer 102 is disposed on an outer side of the negative electrode layer 108.

The negative electrode-side current collecting layer 102 is mechanically and electrically connected to the negative electrode layer 108. The negative electrode-side current collecting layer 102 can function as a negative electrode current collector.

The negative electrode-side current collecting layer 102 can be configured by metal. The negative electrode-side current collecting layer 102 can be configured by the same material as the positive electrode-side current collecting layer 101.

3. Outer Cladding 103, 104

The outer cladding 103 and 104 seals a gap between the positive electrode-side current collecting layer 101 and the negative electrode-side current collecting layer 102. The outer cladding 103 and 104 encloses the lateral side of a unit battery configured by the positive electrode plate 106, the solid electrolyte layer 107 and the negative electrode layer 108. The outer cladding 103, 104 inhibits the entry of moisture into an inner portion.

The outer cladding 103 and 104 may be configured by an electrically insulating adhesive. The adhesive includes use of a resin-based adhesive that contains a resin. The outer cladding 103 and 104 may be formed by stacking layers of a resin film, by dispensing a liquid resin, or the like.

4. Current Collecting Connection Layer 105

The current collecting connection layer 105 is disposed between the positive electrode-side current collecting layer 101 and the positive electrode plate 106. The current collecting connection layer 105 mechanically and electrically bonds the positive electrode plate 106 to the positive electrode-side current collecting layer 101.

The current collecting connection layer 105 includes a conductive material and an adhesive. The conductive material may include use of conductive carbon or the like. The adhesive may include use of a resin material such as an epoxy or the like.

5. Positive Electrode Plate 106

The positive electrode plate 106 is an example of a "positive electrode" according to the present embodiment. The positive electrode plate 106 is formed in a plate shape. Although there is no particular limitation in relation to the thickness of the positive electrode plate 106, it may be configured as greater than or equal to 20 μm, preferably greater than or equal to 25 μm, and more preferably greater than or equal to 30 μm.

The positive electrode plate 106 may be configured by a known positive electrode active substance. A lithium complex oxide is suitable as a positive electrode active substance. A lithium complex oxide is an oxide that is expressed as $Li_xMO_2$ (wherein $0.05<x<1.10$, and wherein M is at least one type of transition metal, and M typically includes one or more types of Co, Ni, Mn). A lithium complex oxide has a layered rock-salt structure.

A lithium complex oxide for example includes $Li_xCoO_2$ (lithium cobalt oxide), $Li_xNiO_2$ (lithium nickelate), $Li_xMnO_2$ (lithium manganate), $Li_xNiMnO_2$ (nickel-lithium manganate), $Li_xNiCoO_2$ (lithium-nickel-cobalt oxide), $Li_xCoNiMnO_2$ (lithium cobalt nickel manganate), $Li_xCoMnO_2$ (cobalt-lithium manganate), with $Li_xCoO_2$ in particular being preferred.

6. Negative Electrode Layer 108

The negative electrode layer 108 is an example of a "negative electrode" according to the present embodiment. The negative electrode layer 108 is disposed on the solid electrolyte layer 107. The negative electrode layer 108 contains a principal component of lithium metal. The negative electrode layer 108 may be configured as a lithium-containing metal membrane formed on the solid electrolyte layer 107. The lithium-containing metal membrane may be formed by a vacuum deposition method, a sputtering method, a CVD method, or the like. Although there is no particular limitation on the thickness of the negative electrode layer 108, it may be configured as less than or equal to 200 μm.

7. Solid Electrolyte Layer 107

The solid electrolyte layer 107 is an example of a "solid electrolyte" according to the present embodiment. The solid electrolyte layer 107 is disposed between the positive electrode plate 106 and the negative electrode layer 108. Although there is no particular limitation on the thickness of the solid electrolyte layer 107, it is preferably 0.1 to 10 μm, more preferably 0.2 to 8.0 μm, and still more preferably 0.3 to 7.0 μm. A configuration in which the thickness of the solid electrolyte layer 107 is greater than or equal to 0.1 μm inhibits short circuiting or the like between the electrodes as a result of an insufficient withstand voltage in the solid electrolyte layer 107 itself or a defect in the membrane when forming the all-solid-state cell. Furthermore, a configuration in which the thickness of the solid electrolyte layer 107 is less than or equal to 10 μm inhibits a reduction in the resistance of the solid electrolyte layer 107.

The solid electrolyte layer 107 is configured by lithium phosphorus oxynitride that is an oxide-based ceramic material (hereinafter referred to as "LiPON".) The composition formula for LiPON for example is $Li_{2.9}PO_{3.3}N_{0.46}$.

The solid electrolyte layer 107 preferably exhibits high lithium ion conductivity. The lithium ion conductivity of the solid electrolyte layer 107 is preferably greater than 2.0 [μS/cm], more preferably greater than or equal to 3.0 [μS/cm], and in particular, preferably greater than or equal to 3.6 [μS/cm].

Composition of Solid Electrolyte Layer 107

1. Overview

The lithium ion conductivity of LiPON that configures the solid electrolyte layer 107 is typically known to improve as there is an increase in the ratio of the atomic percentage of N atoms relative to the atomic percentage of P atoms (referred to below as "N/P ratio") (reference is made to "Investigation of the local structure of LiPON thin films to better understand the role of nitrogen on their performance"). The atomic percentage is defined as the content ratio of respective atoms and the N/P ratio is an index that denotes the content ratio of N atoms in LiPON.

On the other hand, the results of diligent investigations conducted by the present inventors in relation to further enhancing the lithium ion conductivity of LiPON have resulted in the new insight that, in addition to the N/P ratio, the ratio of N atoms that bind to P atoms and the ratio of N atoms that are present as $N_2$ (molecular nitrogen) have a large effect on the lithium ion conductivity of LiPON. More specifically, the present inventors have gained the insight that the lithium ion conductivity of LiPON can be enhanced as the ratio of N atoms that bind to P atoms is increased and the ratio of N atoms that are present as $N_2$ is decreased.

Although detailed information is elusive, N atoms that are present as $N_2$ are those N atoms that are present in a configuration of bonding with another N atoms and not bonding to a P atom of the total of N atoms contained in LiPON.

N atoms that are bonded with a P atom are those N atoms that have bonded with a P atom and are present in an independent configuration as $N_2$ of the total of N atoms contained in LiPON. There are two bonding configurations between P atoms and N atoms. One is when a single N atom has a single bond with a single P atom, and has a double bond with another single P atom (referred to below as "PNP"). The other bonding configuration is when one N atom has single bonds respectively with 3 P atoms. The PNP is dominant in relation to the bonds between the N atoms and the P atoms in LiPON and therefore PNP facilitates detection of the peak intensity in a Raman spectroscopy spectrum. Therefore as shown by the following description, the present inventors paid particular attention to PNP.

2. Multiplication Value of PNP/$N_2$ Ratio and N/P Ratio

The multiplication value of the ratio of the peak intensity in a PNP configuration relative to the peak intensity in an $N_2$ configuration in a Raman spectroscopy spectrum of the solid electrolyte layer 107 (referred to below as "PNP/$N_2$ ratio") and the N/P ratio in the solid electrolyte layer 107 is greater than or equal to 0.40. A configuration in which the multiplication value is greater than or equal to 0.40 enables improvement in the lithium ion conductivity in LiPON due to the frequent presence of N atoms that are bonded to a P atom. Furthermore, configuration in which the multiplication value is greater than or equal to 0.40 exhibits the possibility of inhibiting a reduction in durability and the insulation performance of the LiPON layer as a result of the production of holes in spaces in which N atoms are present in an $N_2$ form due to the reduction of N atoms that are present independently in an $N_2$ configuration. The multiplication value is preferably greater than or equal to 0.70.

The PNP/$N_2$ ratio increases as there is a decrease in the number of N atoms present in an $N_2$ configuration, and increases as there is an increase in the number of N atoms that are bonded to a P atom. The N/P ratio increases as there is an increase in the content amount of N atoms and increases as there is a decrease in the number of P atoms. Therefore these conditions combine to vary the multiplication value of the PNP/$N_2$ ratio and the N/P ratio. The multiplication value as described below can be adjusted with reference to the chamber internal pressure during LiPON membrane formation using a facing target RF sputtering method.

The PNP/$N_2$ ratio for example may be configured as greater than or equal to 1.30. The PNP/$N_2$ ratio is preferably greater than or equal to 1.50, more preferably greater than or equal to 2.00, and still more preferably greater than or equal to 2.67. The N/P ratio may be configured for example as greater than or equal to 0.10. The PNP/$N_2$ ratio is preferably greater than or equal to 0.15, more preferably greater than or equal to 0.22, and still more preferably greater than or equal to 0.26.

3. POP/PO Ratio

O atoms are bonded with P atoms in LiPON that configures the solid electrolyte layer 107. There are two possible configurations of bonding between O atoms and P atoms. One configuration is a state in which there is a single bond between one O atom and two respective P atoms. The other configuration is a state in which one O atom has a single bond with one P atom. In the following description, the former bonding configuration is denoted as "POP" and the latter bonding configuration is denoted as "PO." POP is a state in which an O atom has a single bond with two P atoms and thereby promotes cross bonding between P atoms in LiPON.

The ratio of peak intensity of POP to the peak intensity of PO (referred to below as "POP/PO ratio") in a Raman spectroscopy spectrum of the solid electrolyte layer 107 for example may be configured as greater than or equal to 1.00. The POP/PO ratio is preferably greater than or equal to 1.20, more preferably greater than or equal to 1.45, and still more preferably greater than or equal to 2.85. Further enhancement to LiPON lithium ion conductivity is possible by increasing the POP/PO ratio.

4. Li/P Ratio

The ratio of the atomic percentage of Li atoms relative to the atomic percentage of P atoms in the LiPON that constitutes the solid electrolyte layer 107 (referred to below as "Li/P ratio") may be configured for example as less than or equal to 3.1. The Li/P ratio is preferably less than or equal to 2.8, more preferably less than or equal to 2.6, and particularly preferably greater than or equal to 2.4. Further enhancement to LiPON lithium ion conductivity is possible by reducing the Li/P ratio.

5. Method of Calculation of Respective Ratios

Next, the method of calculating the PNP/$N_2$ ratio, the N/P ratio, the POP/PO ratio and the Li/P ratio will be described making reference to the figures.

PNP/$N_2$ Ratio

Figure 2B:
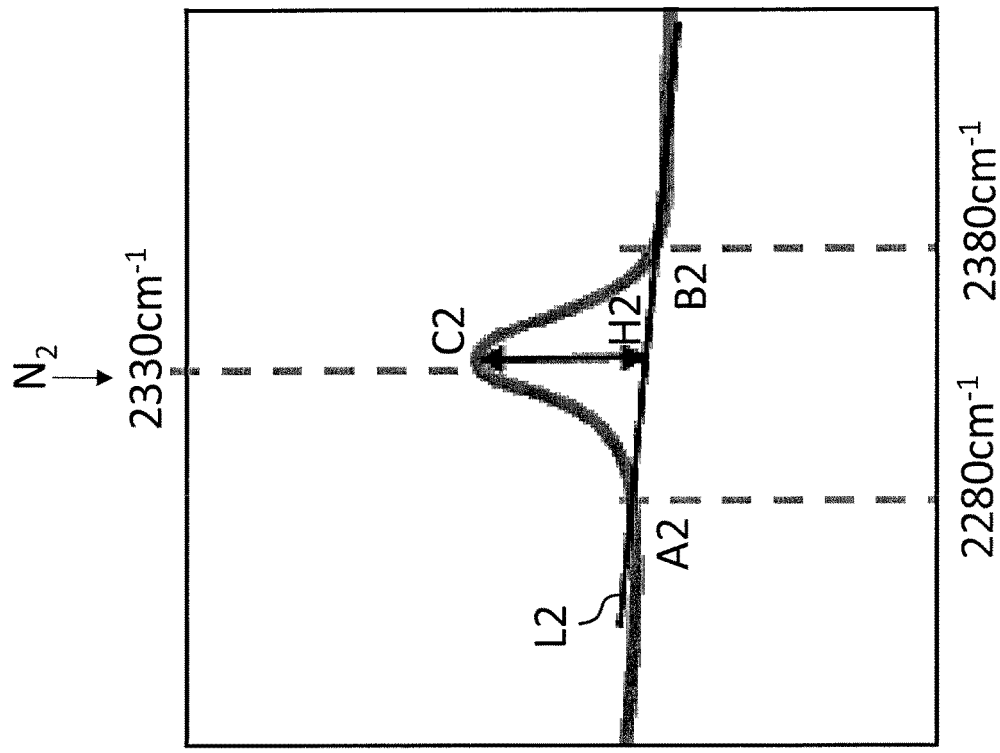
FIG. 2B is a schematic view describing the calculation method for the PNP/$N_2$ ratio.
Figure 2A:
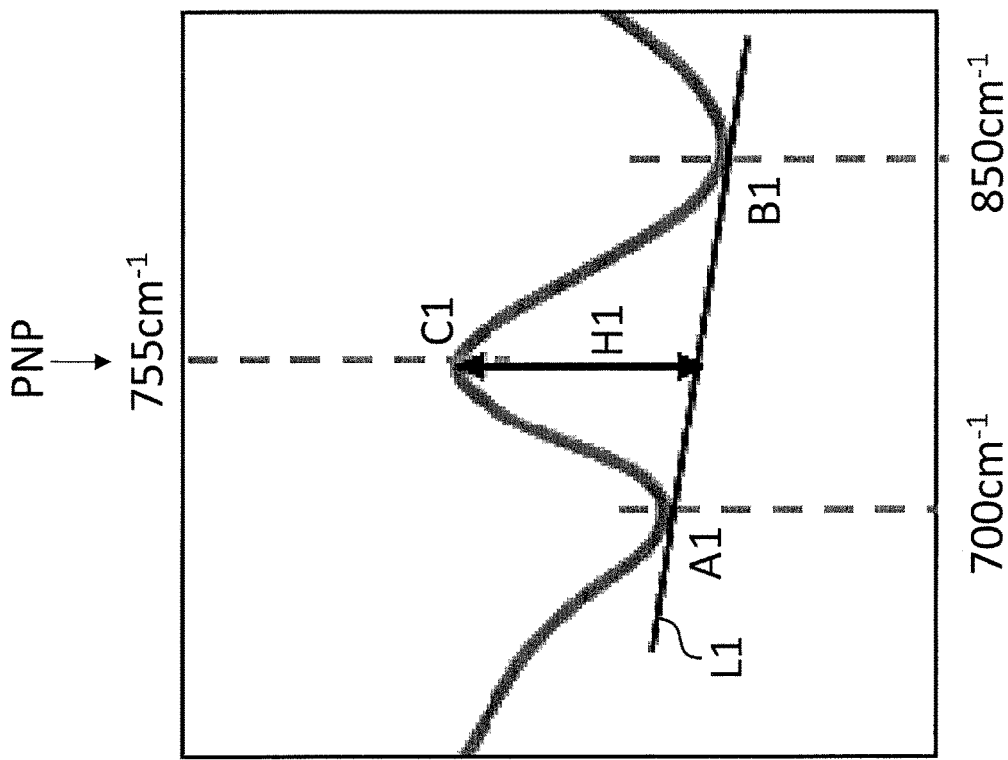
FIG. 2A is a schematic view describing the calculation method for the PNP/$N_2$ ratio.

A configuration is detected with reference to Raman measurement at about 755 $cm^{-1}$ in which one N atom has a single bond with one P atom, and has a double bond with another P atom. In this context, as shown in FIG. 2A, a scattering intensity value A1 at a Raman shift of 700 $cm^{-1}$ is connected by a primary straight line L1 with a scattering intensity value B1 at a Raman shift of 850 $cm^{-1}$ in a Raman spectroscopy spectrum obtained by micro-Raman spectroscopy. The height H1 of the scattering intensity value C1 at a Raman shift of 755 $cm^{-1}$ based on the primary straight line L1 is defined as the PNP peak intensity.

Then, a configuration of an $N_2$ state is detected with reference to Raman measurement at about 2330 $cm^{-1}$. In this context, as shown in FIG. 2B, a scattering intensity value A2 at a Raman shift of 2280 $cm^{-1}$ is connected by a primary straight line L2 with a scattering intensity value B2 at a Raman shift of 2380 $cm^{-1}$. The height H2 of the scattering intensity value C2 at a Raman shift of 2330 $cm^{-1}$ based on the primary straight line L2 that connects the scattering intensity values A2 and B2 is defined as the $N_2$ peak intensity.

The height ratio H1 is divided by the height H2 to thereby calculate the PNP/$N_2$ ratio.

N/P Ratio

The content amount of N atoms and P atoms is quantified by performing X-ray photoelectron spectroscopy measurements (XPS measurements) using a relative sensitivity factor (RSF) method in relation to the composition based on the bonding configuration of the atoms in the LiPON layer.

The XPS measurements are performed in relation to an inner portion of a membrane (omitted below) formed by Ar sputtering from the outermost surface of the LiPON layer. Li, P, O, N and C that is detected as an impurity, that are the elements that form the LiPON layer are quantified and taken in total to be 100%. Then the atomic percentage of N atoms and the atomic percentage of P atoms are quantified to thereby calculate the N/P ratio.

POP/PO Ratio

Figure 3:
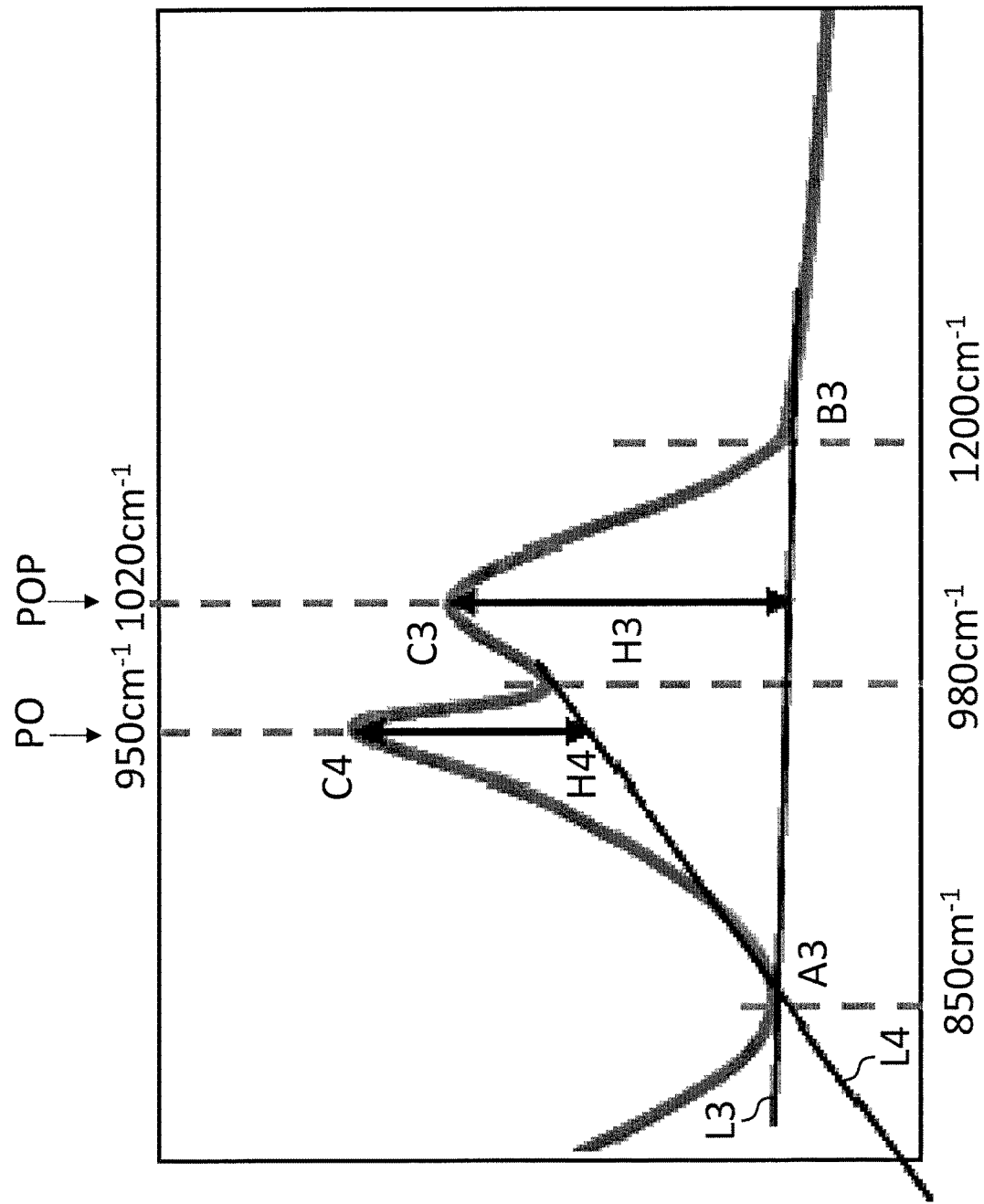
FIG. 3 is a schematic view describing the calculation method for the POP/PO ratio.

A configuration is detected with reference to a Raman measurement at about 1020 $cm^{-1}$ in which one O atom has a single bond with two respective P atoms. In this context, as shown in FIG. 3, a scattering intensity value A3 at a Raman shift of 850 $cm^{-1}$ is connected by a primary straight line L3 with a scattering intensity value B3 at a Raman shift of 1200 $cm^{-1}$ in a Raman spectroscopy spectrum obtained by micro-Raman spectroscopy. The height H3 of the scattering intensity value C3 at a Raman shift of 1020 $cm^{-1}$ based on the primary straight line L3 is defined as the POP peak intensity.

Then, a configuration when one O atom has a single bond with one P atom in a Raman measurement is detected at about 950 cm$^{-1}$. In this context, as shown in FIG. 3, a scattering intensity value A3 at a Raman shift of 850 cm$^{-1}$ is connected by a primary straight line L4 with a scattering intensity value B3 at a Raman shift of 980 cm$^{-1}$. The height H4 of the scattering intensity value C4 at a Raman shift of 950 cm$^{-1}$ based on the primary straight line L4 is defined as the PO peak intensity.

The height ratio H3 is divided by the height H4 to thereby calculate the POP/PO ratio.

Li/P Ratio

The Li amount and P amount are quantified by inductively coupled plasma emission spectrometry in relation to a solution in which the LiPON layer is dissolved in acid to thereby calculate the Li/P ratio.

Method of Manufacturing Solid Electrolyte Layer 107

A substrate (the positive electrode plate 106 when preparing an all-solid-state lithium-ion secondary battery) is disposed in a chamber of a facing target RF sputtering device. Then a solid electrolyte layer 107 formed from LiPON is formed on the substrate by use of a facing target RF sputtering method.

A facing target RF sputtering method is a method in which two targets are disposed in a facing configuration, plasma is retained between the targets by a magnetic field between the facing targets to thereby form a membrane on a membrane-forming substrate that is disposed orthogonally with reference to the target surface. In comparison to a conventionally used magnetron-type RF sputtering method, it is anticipated that a facing target RF sputtering method will enclose the plasma between the targets and thereby promote ionization of sputtering particles or ionization of sputtering gas as a result of repetitive collisions in the plasma between γ electrons, recoil sputtering gas, sputtering particles or the like. Therefore it is expected that $N_2$ bonds will tend to break down when $N_2$ (molecular nitrogen) that is the sputtering gas is formed as a plasma, and thereby promote the formation of bonds between P atoms and N atoms.

In comparison to a conventionally used magnetron-type RF sputtering method, a facing target RF sputtering method does not expose the substrate to the plasma and therefore it is possible to suppress incidence of high-energy negative ions or electrons on the substrate. Consequently, since temperature increase in the substrate can be suppressed, residual stress after membrane formation should be suppressed. As a result, there is the possibility that charge/discharge cycle characteristics will be enhanced by use of such a LiPON layer in an all-solid-state battery.

When forming a solid electrolyte layer 107, the multiplication value of the PNP/$N_2$ ratio and the N/P ratio as discussed above can be configured as greater than or equal to 0.40 by a configuration in which the chamber internal pressure is less than or equal to 1 Pa. Furthermore, the multiplication value may be arbitrarily adjusted by adjusting the chamber internal pressure within a range of less than or equal to 1 Pa.

It is noted that a lithium-phosphate sintered body is used as the target, nitrogen ($N_2$) is used as the sputtering gas, the gas introduction amount is 5 to 50 sccm, and the output per target surface area can be configured as 0.5 to 3.5 W/cm$^2$. The thickness of the solid electrolyte layer 107 can be suitably adjusted in response to the sputtering time.

EXAMPLES

Although the examples of a solid electrolyte layer (LiPON layer) according to the present invention will be described below, the present invention is not thereby limited to the following examples.

Example 1

Firstly, a SUS substrate was prepared by using a DC sputtering method to form a 500 Å metal membrane.

Next, the SUS substrate with the metal membrane formed thereon was disposed in the chamber of a facing target RF sputtering device. Then, a facing target RF sputtering method was used to form a LiPON layer having about a 1 to 5 μm thickness on the surface of the metal membrane. A lithium-phosphate sintered body (density 2.38 g/cm$^3$) was used as the target, nitrogen ($N_2$) was used as the sputtering gas, the gas introduction amount was 10 sccm, an output per target surface area was 2.5 W/cm$^2$ and the chamber internal pressure was 0.2 Pa.

Next, a mask provided with a 5 mm×5 mm window was disposed on the surface of the LiPON layer and a 500 Å metal membrane was formed by a DC sputtering method.

Then, lithium metal was melt-crimped at 185 degrees C. onto the surface of the 5 mm×5 mm metal membrane in a glove box having an Ar atmosphere. The resulting LiPON layer with the lithium metal attached thereto is assembled into a stainless steel CR 2032 case to form a coil cell.

Comparative Example 1

A coin cell according to Comparative Example 1 was prepared using the same steps as Example 1 with the exception that the LiPON layer was formed using a magnetron RF sputtering method. The same lithium-phosphate sintered body (density 2.38 g/cm$^3$) as Example 1 was used as the target for the magnetron RF sputtering method, $N_2$ was used as the sputtering gas, the gas introduction amount was 20 sccm, the output per target surface area was 2.5 W/cm$^2$, the chamber inner pressure was 0.2 Pa.

Examples 2 to 5, Comparative Example 2

A coin cell according to Examples 2 to 5 and Comparative Example 2 was prepared using the same steps as Example 1 with the exception that the chamber inner pressure when forming the LiPON layer was varied as shown in Table 1.

Measurement of Lithium Ion Conductivity

The lithium ion conductivity of the LiPON layer respectively in Examples 1 to 5 and Comparative Examples 1 and 2 was evaluated by alternating current impedance measurement. The alternating current impedance measurement was measured at a frequency of 300 kHz~0.1 Hz and a voltage of 10 mV. An arc of the resulting impedance curve was fitted, and contact points with the x axis of the arc were taken to be resistance values. The lithium ion conductivity was calculated based on the electrode surface area (5 mm×5 mm square) and the thickness of the LiPON layer.

Calculation of N/P Ratio

X-ray photoelectron spectroscopy measurements (XPS measurements) were performed to thereby quantify the composition based on the bonding configuration of the atoms in the LiPON layer using a relative sensitivity factor (RSF) method. The XPS measurement device (ESCA-5700ci model manufactured by ULVAC-PHI Inc.) was directed to an inner portion of an Ar sputtered membrane from the outermost layer of the LiPON layer using monochromatic AlKα rays as an X ray source and C1s (284.8 eV) as a charge compensation reference.

Li, P, O, N, and C that is detected as an impurity, that are the elements that form the LiPON layer were quantified as the composition based on an XPS spectrum of Li(1s), P (2p), O (1s), N (1s) and C (1s). The calculation results are shown in Table 1.

Calculation of PNP/N$_2$ Ratio

A Raman spectroscopy spectrum for the LiPON layer was obtained by use of micro-Raman spectroscopy. The Raman measurements used LabRAM ARAMIS manufactured by Horiba Ltd to irradiate a visible light laser (green color, wavelength 532 nm, output 24 W) in an orthogonal configuration onto the LiPON layer and thereby detect the backscattered Raman scattered light. The measurement range of the Raman measurements was 70 cm$^{-1}$ to 2500 cm$^{-1}$.

A configuration was detected in a Raman measurement at about 755 cm$^{-1}$ in which one N atom has a single bond with one P atom, and has a double bond with another P atom. The N$_2$ configuration was detected at about 2330 cm$^{-1}$. Furthermore a configuration was detected at about 1020 cm$^{-1}$ in which one O atom has a single bond with two respective P atoms. A configuration when one O atom has a single bond with one P atom was detected at about 950 cm$^{-1}$.

Next the height H1 of the scattering intensity value C1 at a Raman shift of 755 cm$^{-1}$ based on the primary straight line L1 that joins a scattering intensity value A1 at a Raman shift of 700 cm$^{-1}$ with a scattering intensity value B1 at a Raman shift of 850 cm$^{-1}$ in a Raman spectroscopy spectrum was defined as the PNP peak intensity (reference is made to FIG. 2A).

The height H2 of the scattering intensity value C2 at a Raman shift of 2330 cm$^{-1}$ based on the primary straight line L2 that joins the scattering intensity value A2 at a Raman shift of 2280 cm$^{-1}$ with the scattering intensity value B2 at a Raman shift of 2380 cm$^{-1}$ in a Raman spectroscopy spectrum was defined as the N$_2$ peak intensity (reference is made to FIG. 2B).

The height ratio H1 was divided by the height H2 to thereby calculate the PNP/N$_2$ ratio (peak intensity ratio). The calculation results are shown in Table 1.

Calculation of POP/PO Ratio

Firstly, in the Raman spectroscopy spectrum as described above, the height H3 of the scattering intensity value C3 at a Raman shift of 1020 cm$^{-1}$ based on the primary straight line L3 that joins the scattering intensity value A3 at a Raman shift of 850 cm$^{-1}$ with a scattering intensity value B3 at a Raman shift of 1200 cm$^{-1}$ was defined as the POP peak intensity (reference is made to FIG. 3).

Then, the height H4 of the scattering intensity value C4 at a Raman shift of 950 cm$^{-1}$ based on the primary straight line L4 that joins the scattering intensity value A3 at a Raman shift of 850 cm$^{-1}$ with a scattering intensity value B3 at a Raman shift of 980 cm$^{-1}$ was defined as the PO peak intensity (reference is made to FIG. 3).

The height ratio H3 is divided by the height H4 to thereby calculate the POP/PO ratio (peak intensity ratio). The calculation results are shown in Table 1.

Li/P Ratio

The Li/P ratio (atomic ratio) was measured by inductively coupled plasma emission spectrometry in relation to a solution in which the respective LiPON layers were dissolved. The calculation results are shown in Table 1.

Measurement of Membrane Stress

The membrane stress was evaluated by a substrate curvature method. A LiPON layer that is the same as Example 1 and Comparative Example 1 was formed on a glass plate (length 25 mm, width 5 mm, thickness 50 μm).

The glass plate was placed in a cantilevered configuration and the deflection amount of one free end (deflection amount δ of LiPON layer) was measured by a laser microscope (manufactured by Keyence) to thereby calculate the membrane stress by use of the stoney formula: $\sigma=\{E\delta/3\,(1-v)L^2\}*h^2/t$. E denotes the Young's modulus of the glass (64 GPa), v is the Poisson ratio of the glass (0.208), t is the membrane thickness of the LiPON layer.

Crystal Structure Analysis

The LiPON layer was subjected to X ray diffraction measurement which did not detect a specific peak from the LiPON layer, and in the same manner as LiPON layers that have been reported in the literature, there was an amorphous (non-crystalline) configuration. X ray diffraction measurements were conducted using an X ray diffractometer (D8-ADVANCE) and used CuKα rays as the X ray source.

TABLE 1

| | LiPON Formation Method | | | | | | | | |
|---|---|---|---|---|---|---|---|---|---|
| | Sputtering Method | Chamber Internal Pressure (Pa) | Lithium Ion Conductivity (μS/cm) | PNP/N$_2$ | N/P | POP/PO | Li/P | (PNP/N$_2$) × (N/P) | Residual Stress (MPa) |
| Comparative Example 1 | Magnetron-type | 0.2 | 2.0 | 1.23 | 0.26 | 1.45 | 2.8 | 0.32 | 150 |
| Example 1 | Facing Target | 0.2 | 3.6 | 2.80 | 0.26 | 2.85 | 2.4 | 0.73 | 11 |
| Example 2 | Facing Target | 0.5 | 3.0 | 3.32 | 0.22 | 1.50 | 2.6 | 0.73 | — |
| Example 3 | Facing Target | 0.1 | 3.8 | 3.40 | 0.28 | 2.93 | 2.3 | 0.95 | — |
| Example 4 | Facing Target | 0.05 | 4.0 | 3.34 | 0.30 | 3.08 | 2.1 | 1.00 | — |
| Example 5 | Facing Target | 1 | 2.1 | 2.67 | 0.15 | 1.20 | 3.1 | 0.40 | — |
| Comparative Example 2 | Facing Target | 2 | 1.7 | 1.01 | 0.06 | 0.56 | 3.6 | 0.06 | — |

As shown in Table 1, the lithium ion conductivity in Examples 1 to 5 in which the multiplication value of the PNP/N$_2$ ratio (peak intensity ratio) and the N/P ratio (atomic ratio) was greater than or equal to 0.40 was superior in comparison to Comparative Examples 1 and 2. Furthermore, irrespective of the fact that Example 1 and Comparative Example 1 exhibited the same N/P ratio, since the PNP/N$_2$ ratio of Example 1 was large when compared to Comparative Example 1, the reduction in the N atoms that are present independently raises the possibility that adverse effects on the insulation characteristics and durability of the LiPON layer could be reduced as a result of the formation of pores in spaces in which N atoms are present in an $N_2$ configuration.

These results are thought to be promoted by bonding between N atoms and P atoms as a result of a facing target RF sputtering method.

Furthermore, a multiplication value of greater than or equal to 0.40 can be achieved by a chamber internal pressure of less than or equal to 1 Pa during membrane formation of the LiPON layer by a facing target RF sputtering method. It was confirmed that since the N/P ratio increases as the chamber internal pressure decreases, the multiplication value increased.

Example 1 used a facing target RF sputtering method and enabled a large reduction in residual stress compared to Comparative Example 1 that used a magnetron RF sputtering method. In light of the above, when an all-solid-state battery was prepared with reference to the LiPON layer of the present invention, since residual stress between the positive electrode and the LiPON layer could be reduced, there is the possibility that charge/discharge cycle characteristics will be enhanced.

As shown in Table 1, lithium ion conductivity in Examples 1 to 5 was confirmed to be enhanced as the N/P ratio was increased. In comparison to Examples 2 and 5, lithium ion conductivity was conspicuously enhanced by increasing the introduction amount of N atoms in Examples 1, 3 and 4 in which the N/P ratio was greater than or equal to 0.26. However, when Example 1 is compared with Comparative Example 1 as described above, since the $PNP/N_2$ ratio increases at about the same N/P ratio, and for that reason, the lithium ion conductivity increases as the related multiplication value increases, lithium ion conductivity may be understood to be rate limited by the multiplication value of the $PNP/N_2$ ratio and the N/P ratio rather than the N/P ratio in isolation.

As shown in Table 1, lithium ion conductivity in Examples 1 to 5 was confirmed to be enhanced as the POP/PO ratio (peak intensity ratio) was increased. In comparison to Examples 2 and 5, lithium ion conductivity was conspicuously enhanced by promoting bonding between P atoms and O atoms in Examples 1, 3 and 4 in which the POP/PO ratio was greater than or equal to 2.85. However, when Example 5 is compared with Comparative Example 1 as described above, since lithium ion conductivity of Example 5 is high irrespective of whether or not the POP/PO ratio of Comparative Example 1 is higher or not, lithium ion conductivity may be understood to be rate limited by the multiplication value of the $PNP/N_2$ ratio and the N/P ratio rather than the POP/PO ratio.

As shown in Table 1, lithium ion conductivity in Examples 1 to 5 was confirmed to be enhanced as the Li/P ratio (atomic ratio) was decreased. In comparison to Examples 2 and 5, lithium ion conductivity was conspicuously enhanced by inhibiting the introduction amount of Li atoms in Examples 1, 3 and 4 in which the Li/P ratio was less than or equal to 2.4. However, since lithium ion conductivity in Example 5 is high irrespective of whether or not the Li/P ratio of Comparative Example 1 is smaller than the Li/P ratio of Example 5, the lithium ion conductivity may be understood to be rate limited by the multiplication value of the $PNP/N_2$ ratio and the N/P ratio rather than the Li/P ratio.

The invention claimed is:

1. A solid electrolyte comprising lithium phosphorus oxynitride,
wherein a multiplication value obtained by multiplying a ratio of a peak intensity of nitrogen atoms having a single bond with one P atom and having a double bond with another P atom to a peak intensity of an $N_2$ state in a Raman spectroscopy spectrum by a ratio of a content amount of N atoms to a content amount of P atoms is greater than or equal to 0.40.

2. The solid electrolyte according to claim 1,
wherein a ratio of an atomic percentage of N atoms to an atomic percentage of P atoms in the lithium phosphorus oxynitride is greater than or equal to 0.15.

3. The solid electrolyte according to claim 1,
wherein a ratio of an atomic percentage of Li atoms to an atomic percentage of P atoms in the lithium phosphorus oxynitride is less than or equal to 3.1.

4. The solid electrolyte according to claim 1, wherein a ratio of peak intensity of POP to a peak intensity of PO in the Raman spectroscopy spectrum of the lithium phosphorus oxynitride is greater than or equal to 1.20.

5. An all-solid-state lithium-ion secondary battery comprising:
a positive electrode,
a negative electrode, and
a solid electrolyte according to claim 1, wherein
the solid electrolyte is disposed between the positive electrode and the negative electrode.

6. The all-solid-state lithium-ion secondary battery according to claim 5, wherein the positive electrode is configured by $Li_xCoO_2$, and wherein $0.05<x<1.10$.

7. The all-solid-state lithium-ion secondary battery according to claim 5, wherein the negative electrode contains lithium metal as a main component.

8. A method of producing a solid electrolyte comprising:
a step of forming lithium phosphorus oxynitride by use of a facing target RF sputtering method, wherein
a chamber internal pressure during sputtering is less than or equal to 1 Pa in the step of forming the lithium phosphorus oxynitride, and
wherein a multiplication value obtained by multiplying a ratio of a peak intensity of nitrogen atoms having a single bond with one P atom and having a double bond with another P atom to a peak intensity of an $N_2$ state in a Raman spectroscopy spectrum by a ratio of a content amount of N atoms to a content amount of P atoms is greater than or equal to 0.40.

* * * * *